United States Patent [19]

Kojima et al.

[11] 3,737,803

[45] June 5, 1973

[54] CONTROL SYSTEM FOR ELECTRIC CIRCUIT UTILIZING PHOTOSENSITIVE SOLID OSCILLATOR

[75] Inventors: Kiyoshi Kojima; Toshiro Abe, both of Osaka, Japan

[73] Assignee: Matsushita Electric Works, Ltd., Osaka, Japan

[22] Filed: Feb. 3, 1972

[21] Appl. No.: 223,121

Related U.S. Application Data

[63] Continuation-in-part of Ser. No. 889,236, Dec. 30, 1969, Pat. No. 3,665,340.

[30] Foreign Application Priority Data

| | | |
|---|---|---|
| Jan. 5, 1969 | Japan | 44/1264 |
| Feb. 14, 1969 | Japan | 44/11180 |
| Mar. 31, 1969 | Japan | 44/25113 |
| Apr. 24, 1969 | Japan | 44/32102 |
| Apr. 30, 1969 | Japan | 44/33831 |

[52] U.S. Cl. ................ 331/107 R, 315/134, 315/158, 317/235 T, 317/235 N, 325/105, 331/66, 331/172

[51] Int. Cl. .................................................H03b 7/06

[58] Field of Search .....................331/107 R, 66, 172; 315/134, 158; 317/235 T, 235 N; 325/105

*Primary Examiner*—John Kominski

*Attorney*—Wolfe, Hubbard, Leydig, Voit & Osann, Ltd.

[57] ABSTRACT

Control system for electric circuits utilizing a photosensitive solid oscillator which comprises an impurity layer formed on a surface of a semi-conductor wafer, two separate impurity layers formed on the other surface of said wafer as spaced from each other, and electrodes respectively provided at least on each of the latter two impurity layers, the respective impurity layers on both surfaces of the wafer being of a reversely conducting type semiconductor with respect to said wafer and containing an impurity of a higher concentration than in the wafer. Source voltage to said electric circuit is supplied through the photosensitive solid oscillator, and the operation of the circuit is controlled by a pulse type oscillation output of the oscillator having an oscillating frequency which varies depending on variations in light amount or source voltage.

7 Claims, 15 Drawing Figures

CONTROL SYSTEM FOR ELECTRIC CIRCUIT UTILIZING PHOTOSENSITIVE SOLID OSCILLATOR

CROSS-REFERENCE TO RELATED APPLICATION

The present application is a continuation-in-part of the copending Kojima et al. application Ser. No. 889,236, filed Dec. 30, 1969, now U.S. Pat. No. 3,665,340, for "Photosensitive Solid Oscillator."

This invention relates in general to electric circuit control systems depending on varying light amount or source voltage and, more particularly, to the such systems for controlling operations of any load circuit connected to output side of a photosensitive solid oscillator having an oscillating frequency which varies depending on variations in the amount of a light irradiated or in source voltage supplied to said solid oscillator.

It is already known that there is a PN junction in a semiconductor and that, when a voltage is added to such junction in a reverse direction, an oscillator is produced.

Further, there is also known a semiconductor element having a PIN junction with an I layer which is very low in the impurity concentration. It is also known that an oscillation is produced by adding a voltage to this element. However, these elements have no photosensitivity.

It is also known that a so-called phototransistor has photosensitivity. However, in such phototransistor, only the current increases with the light but no oscillating phenomenon is produced.

The inventors of the present invention have suggested in the aforementioned copending application Ser. No. 889,236 of Kojima et al. a novel solid oscillator having a photosensitivity an oscillating phenomenon.

The object of the present invention is to provide a system which is capable of controlling the operation of electric circuits depending on variations in the light amount or source voltage, utilizing such feature of the photosensitive solid oscillator that the frequency of its oscillating output can be modulated by light.

Since the photosensitive solid oscillator utilized in the present invention is featured in:

1. that the oscillating frequency can be varied with the impressed voltage,
2. that the frequency-modulation can be made by externally adding an impedance, capacitance or inductance,
3. that the oscillation starting point and stopping point can be varied by varying the bias voltage and the frequency of the oscillating output can be modulated by varying additionally applied bias voltage, and
4. that, due to the oscillation output, a wireless or wire signal transmission is easy, the system according to the present invention can be applied to various types of electric circuits.

Other objects and advantages of the present invention will become clear upon reading the following disclosures detailed with reference to accompanying drawings, in which.

While the invention shall be explained with reference to the embodiments as illustrated, it should be understood that the intention is not to limit the invention to the particular embodiments, but rather to cover all the modifications, alterations and equivalent arrangements to be included in the scope of the appended claims.

Figure 1:
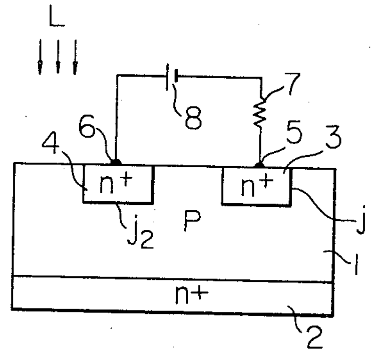
FIG. 1 shows an embodiment of the photosensitive solid oscillator utilized in the present invention.

In FIG. 1 showing the first embodiment of the photosensitive solid oscillator to be used in the present invention, 1 is a p-type semiconductor wafer, 2 is a first impurity layer that is a n-type conductor formed on one surface of the above mentioned p-type semiconductor wafer and a layer of a concentration higher than of the wafer 1. 3 and 4 are respectively second and third impurity layers consisting of n-type semiconductors formed in two parts separated from each other on the other surface of the above mentioned wafer 1. 5 and 6 are electrodes provided respectively on the surfaces of the above mentioned impurity layers 3 and 4. A direct current source 8 is connected between the above mentioned electrodes 5 and 6 through an output resistor 7 to form an oscillating circuit.

Figure 2:
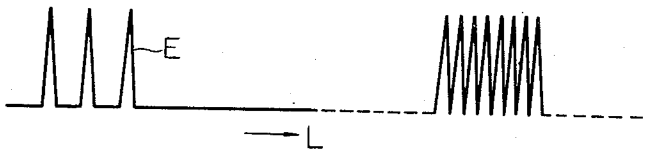
FIGS. 2 to 4 are its characteristics diagrams.

When a direct current voltage is impressed on the above mentioned photosensitive solid oscillator in the direction shown in the drawing and is increased, at some voltage, an oscillation occurs. In such case, if the above mentioned oscillator is irradiated with a light and the light quantity is varied, as shown in FIG. 2, with the light quantity L, the oscillating frequency f of the oscillating voltage E (appearing at both ends of the output resistor 7) varies.

Figure 3:
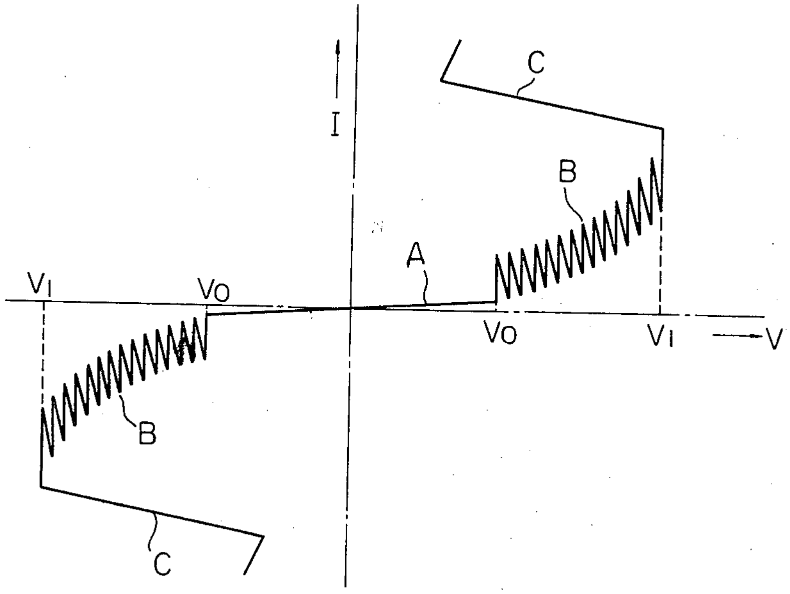

This oscillating state shall be explained with reference to FIG. 3. To the direct current voltage of such polarity as is shown in FIG. 1, the junction $j_2$ of the n-type semiconductor impurity layer 4 and the p-type semiconductor wafer 1 becomes a reverse junction. If a reverse direction voltage is impressed on this part, this oscillator is in a current impeding range A up to a fixed voltage $V_0$. When the impressed voltage exceeds said fixed voltage, the oscillator begins to oscillate and enters an oscillating range B. When the voltage is further elevated until a voltage $V_1$ is reached, the oscillation of the oscillator stops and enters a negative resistance zone C. On the other hand, if a light is projected onto the oscillator, the oscillating zone B shifts to a lower voltage side and the oscillating characteristic of the oscillator varies. This characteristic is dipolar.

Figure 4:
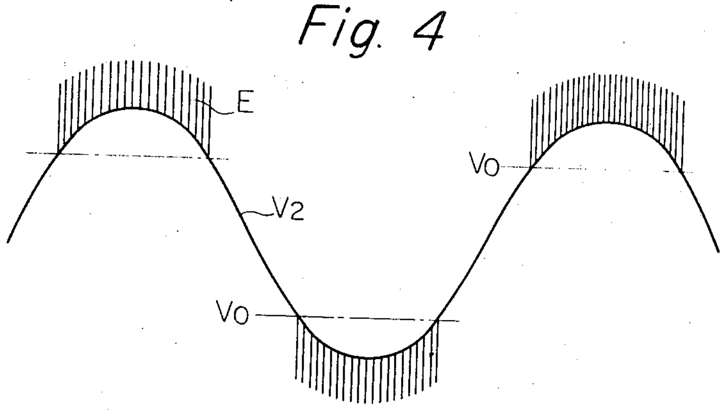

The oscillator oscillates because an avalanche occurs in the oscillating zone B. The oscillating characteristic varies with the irradiation with the light presumably because, when a reverse direction voltage is added to the P-N junction and the element is irradiated with a light, a pair of an electron and a hole occur, the electron flows to the N-type part and the hole flows to the P-type part. A carrier produced by the irradiation of a part distant from the junction with the light decreases partly by a recombination but, for example, at a point distant by about a diffusion distance $L_n$ of electron from the P-type part, the electrons produced due to the light are so low in the rate of the recombination that they can flow to the junction. Further as there is this light current, a few carriers from the n-type part vary so as to be favorable to inject into a p-type part and the injected current is amplified. Therefore, the light current and the current by this injection are added together and flow into a reverse junction. Further, with the addition of the increase of the avalanche multiplication rate of the electrons, the photosensitivity comes to increase. After the beginning of the oscillation, if the quantity of light to be projected onto the oscillator is varied, in response to the light quantity L, as shown in FIG. 4, the oscillating frequency of the oscillating voltage E varies.

The above mentioned phenomenon shall be explained with reference to an actual experiment.

The p-type semiconductor wafer 1 is formed of a wafer of p-type Si of a specific resistance of 30Ωcm and thickness of 200$\mu$, has a film of $SiO_2$ pasted on one surface and is perforated for the n-type semiconductor impurity layers 3 and 4. By diffusing phosphorus as an n-type impurity source, the n-type semiconductor impurity layers 3 and 4 of a surface concentration of 1 × 20/cm$^3$ and thickness of about 10$\mu$ are formed. In the same manner, the n-type semiconductor impurity layer 2 of a thickness of about 10$\mu$ is formed on the other surface of the p-type semiconductor wafer 1. The above mentioned impurity layers 3 and 4 are provided with respective Ni electrodes. Said wafer is cut to be a rectangle of 1 × 2 mm to obtain a photosensitive solid oscillator.

When a direct current voltage is impressed to the above obtained oscillator through the output resistor 7 of 2kΩ, while a light is irradiated, at a voltage of about 100 V, the oscillator begins to oscillate and thereafter, in response to the light quantity L, the oscillating frequency varies.

In the photosensitive solid oscillator according to the present invention, irrespective of the polarity of the direct current source 8, against electrodes 5 and 6 such characteristic as is mentioned above is obtained. Therefore, it can be used as an oscillator for both direct current and alternating current. Further, by impressing an alternating current voltage $V_2$, as shown in FIG. 4, an oscillating voltage can be obtained in each half cycle.

Figure 5:
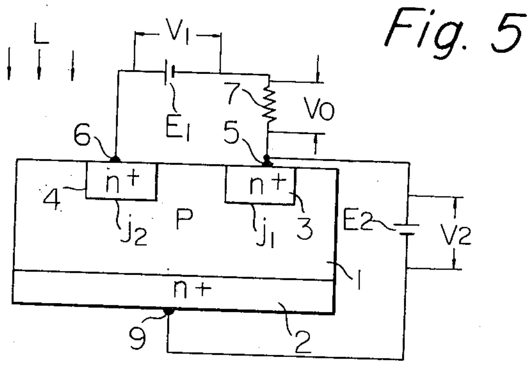
FIG. 5 shows a second embodiment of the solid oscillator

In FIG. 5 showing a second embodiment provided with a bias electrode, 1 is a p-type semiconductor wafer, 2, 3 and 4 are respectively the same impurity layers as in the first embodiment, 5 and 6 are main electrodes, 7 is an output resistor, $E_1$ is a direct current source, 9 is a bias electrode provided in the impurity layer 2 and $E_2$ is a direct current for the bias. This current source $E_2$ is connected between the main electrode 5 or 6 in common and the bias electrode 9 so that the main electrode is on the plus side and the bias electrode is on the minus side.

In the above mentioned oscillator, when the maid direct current source $E_1$ is connected so as to be in a normal direction with respect to the junction $j_1$ of the n-type semiconductor impurity layer 3 and p-type semiconductor wafer 1 through the output resistor 7 between the main electrodes 5 and 6. When the voltage $V_1$ is elevated, an oscillation is started. In such case, if the oscillator is irradiated with a light and the light quantity is varied, the oscillating frequency varies with the light quantity. This state is the same as in the case of the first embodiment (shown in FIGS. 2 and 3).

Figure 6:
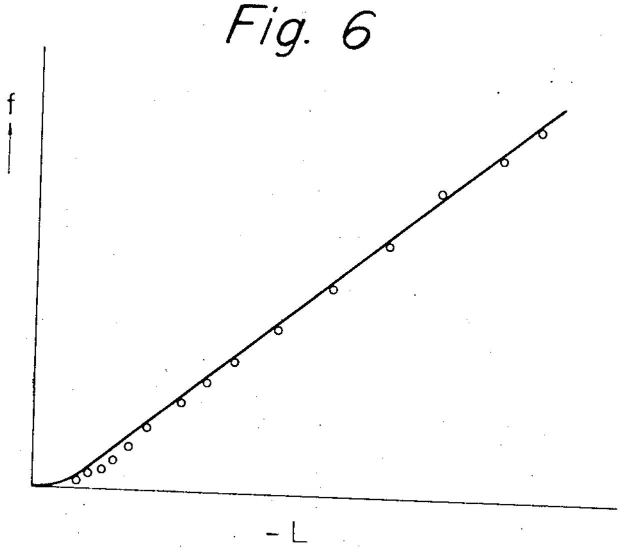
FIGS. 6 to 9 are its characteristic diagrams.
Figure 7:
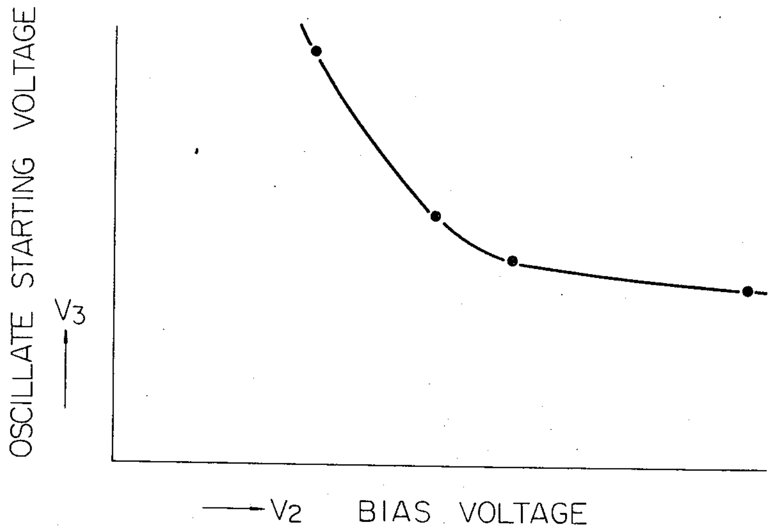
Figure 8:
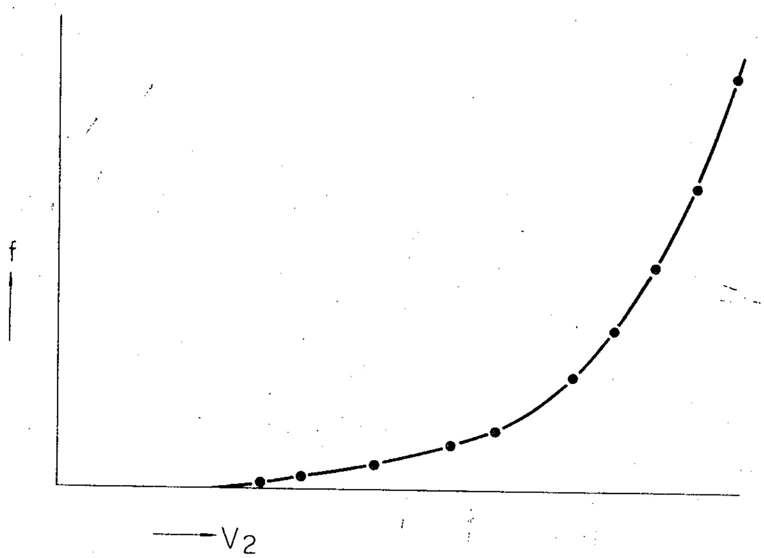

After the oscillation is started, if the oscillator is irradiated with a light and the light quantity is varied, there is obtained a characteristic that the oscillating frequency $f$ of the oscillating voltage $V_c$ varies with the light quantity L as in FIG. 6. In such case, if such bias direct current source $E_2$, as makes the n-type semiconductor impurity layer 3 positive, is connected between the electrodes 5 and 9 and the bias voltage $V_t$ is impressed, the current passing through the n-type semiconductor impurity layer varies depending on the magnitude of the voltage $V_2$, the magnitude of the main voltage $V_3$ at which the oscillator begins to oscillate varies as in FIG. 7 and the light quantity L frequency $f$ characteristic also varies greatly. Further, even if the light quantity L is constant, if the bias voltage $V_2$ is varied, the oscillating frequency f varies as in FIG. 8. In such case, even if the polarity of the main voltage $V_1$ or bias voltage $V_2$ is reversed, a characteristic that the oscillation starting main voltage $V_3$ and oscillating frequency f vary by the bias voltage $V_2$ is obtained.

Figure 9:
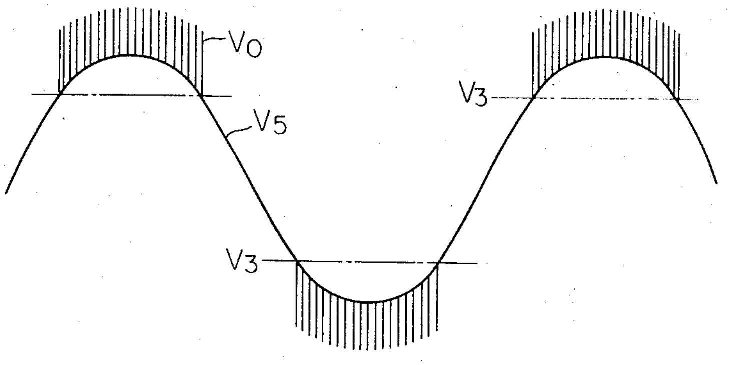

The photosensitive solid oscillator utilized in the present invention is formed and operates as mentioned above. There is an effect that not only, in case a main voltage larger than a constant is given, the oscillating is started and the oscillating frequency is varied with the light quantity with which the oscillator is irradiated but also, by varying the bias voltage added between the bias electrodes, the oscillation starting main voltage and light quantity-oscillating frequency characteristic if varied and, even if the light quantity is constant, by varying the bias voltage, an oscillating frequency corresponding to the bias voltage is obtained. Further, there are effects that, with the electrodes 5 and 6, irrespective of the polarity of the direct current source $E_1$, the above mentioned characteristics are obtained and, therefore, it is adapted as an oscillator for alternating currents and, as in FIG. 9, by impressing an alternating current voltage $V_5$, an oscillating voltage $V_0$ can be obtained in each half cycle.

Some application circuits according to the present invention in which the photosensitive solid oscillator as described in the foregoing is utilized shall be explained in the following.

Figure 10:
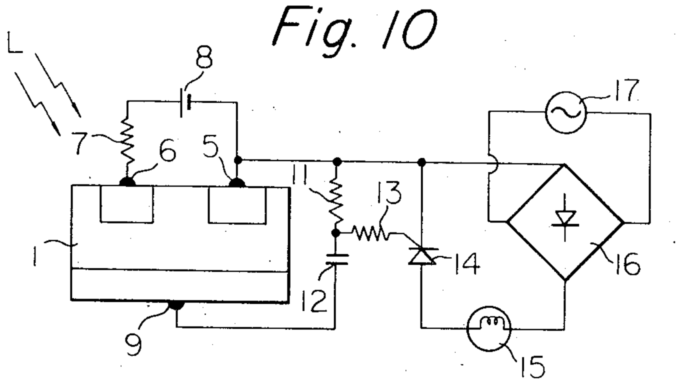
FIG. 10 shows a first embodiment of the control system according to the present invention which is adapted to control a thyristor using the oscillator of FIG. 1.

In FIG. 10 showing a thyristor control circuit, 1 is a photosensitive solid oscillator, 5, 6 and 9 are its electrodes, 8 is a direct current source, 7, 11 and 13 are resistors, 12 is a condenser, 14 is a thyristor, 15 is a lamp, 16 is a rectifying device and 17 is an alternating current source. In the illustrated connection, when the photosensitive solid oscillator 1 is irradiated with a light L and the quantity of the light L exceeds a fixed value, an oscillation starts. When the light L is varied, the oscillating frequency varies. There is a characteristic that, if the irradiating light L is increased to a certain value, the oscillation stops. An oscillating voltage is obtained from both ends of the resistor 11 and is given to the gate of the 14. 14.

In such circuit, in case the light L with which the photosensitive solid oscillator 1 is irradiated is smaller than a fixed value, the photosensitive solid oscillator 1 does not oscillate, no oscillating voltage is obtained, no trigger signal is fed to the thyristor 14, the thyristor remains impeded, no current is fed to the load incandescent lamp 15 and the lamp remains unlighted. Now, when the light L exceeds the fixed value, the photosensitive solid oscillator 1 begins to oscillate at about 10 $KH_z$ and produces a pulse voltage of about 200 pulses in the half cycle of an alternating current voltage source 17. this oscillating voltage is impressed to the gate of the thyristor 14, the thyristor 14 is triggered by the pulse voltage, the thyristor 14 becomes conductive, and a load current is fed to the incandescent lamp 15 to light it. When the irradiating light becomes larger, the oscillating frequency of the photosensitive solid oscillator 1 becomes higher. However, the oscillating frequency is so high that the first oscillating phase in each half cycle of the alternating current of the pulse voltage substantially synchronizes with the zero point passing phase of each cycle of the alternating current, the conducting section of the thyristor remains in an all conducting state and the brightness of the incandescent lamp 15 does not substantially vary. When the irradiating light L exceeds a next fixed value higher than said fixed value, the photosensitive solid oscillator again stops the oscillation, the thyristor in untriggered and returns to its non-conductive state and the incandescent lamp 15 comes to be in an unlighted state.

In the above mentioned example, the thyristor can be opened and closed with the quantity of the light added to the photosensitive solid oscillator and the oscillating frequency is so high that it is possible to disconnect the light detecting part and the load circuit from each other and also to make a remote control by using an antenna or the like.

While in the above described embodiment the feature of the photosensitive solid oscillator that the larger the light amount the higher the oscillation frequency and the smaller the light amount the lower the oscillation frequency is utilized, it is possible to obtain a reverse featured phenomenon that the larger the limit amount the lower the oscillation frequency and the smaller the light amount the higher the oscillation frequency, by combining a pair of photosensitive solid oscillators of the kind referred to in such manner that the first one of the oscillators which is normally oscillated is so connected to the second one of the oscillators as to be supplied with the output from the second oscillator as a bias voltage, whereby the output of the reversed feature is obtained at the output end of the first oscillator.

Figure 11:
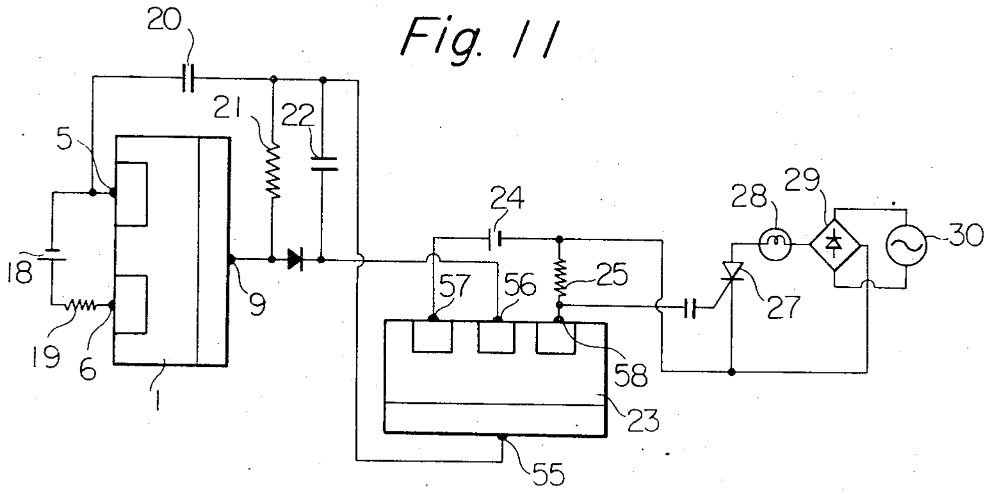
FIG. 11 shows a second embodiment of the system, which is adapted to be a photosensitive switching circuit using a further oscillator having a bias electrode.

FIG. 11 shows an embodiment of the system according to the present invention as applied to a photosensitive switching circuit system using the photosensitive solid oscillator and, more particularly, in this photosensitive switching circuit system, the above described phenomenon of the combination of two photosensitive solid oscillators that, when the light is strong, the oscillation frequency will become low or stop but, when the light is weak, the oscillation frequency will become high is utilized.

This circuit system has as a main formation a combination of the oscillator 1 as shown in FIG. 1 or 5 and a second oscillator 23 which differs from said oscillator 1 in having another bias electrode 56 on a fourth impurity layer formed between the second and third impurity layers having electrodes 57 and 58.

An oscillation voltage depending on the variation of the light amount produced at both ends of a resistor 21 connected between the main electrode 5 and the bias electrode 9 through a condenser 20 is smoothed by a condenser 22 and is impressed between bias electrodes 55 and 56 of the second oscillator 23. The second oscillator 23 is connected in such manner that, when a signal of said oscillation voltage is received between the bias electrodes 55 and 56, an output voltage will be obtained at both ends of an output resistor 25 connected between main electrodes 57 and 58 through another main direct current source 24.

Therefore, in the present system, it will be noted that the oscillator 23 corresponds to the oscillator 1 in the above described embodiment of FIG. 10 and the part including the oscillator 1 through the resistor 21 in the present system is to function a bias voltage source for the oscillator 23.

27 is a thyristor inserted in a load circuit including a lamp 28 and current source devices 29 and 30 and connected so that the gate signal of the thyristor will be obtained from both ends of the output resistor 25.

In such circuit system, now, if the solid oscillator is irradiated with a light, an oscillator voltage varying with the amount of the light will be obtained at both ends of the resistor 21, and an output voltage of the condenser 22 will be obtained as a voltage substantially proportional to the oscillation frequency of the oscillating voltage and becoming higher in the voltage value with an increase in the light. Such direct current output voltage will be applied between the bias electrodes 55 and 56 of the second oscillator 23, the oscillation frequency of the oscillator 23 which is in an oscillating state due to being given an output voltage in advance by the main direct current source 24 will become lower depending on the magnitude of the above mentioned direct current output voltage and therefore, an oscillation voltage of a characteristic that, the larger the light amount, the lower the oscillation frequency, will be obtained from the output terminal of the oscillator 23.

When the light becomes stronger and the above mentioned direct current output becomes higher, the oscillation at both ends of the output resistor 25 will stop, the thyristor 27 will be in a nonconducting state and the lamp 28 will remain put out.

On the contrary, when the light is weak, the oscillation frequency at both ends of the output resistor 25 will become higher, the thyristor 27 will be in a conducting state and the lamp will be in a lighted state.

In the above described system, it should be noted that the output of the photosensitive solid oscillator 1 may be taken out by a transformer coupling instead of the output resistor 21.

Figure 12:
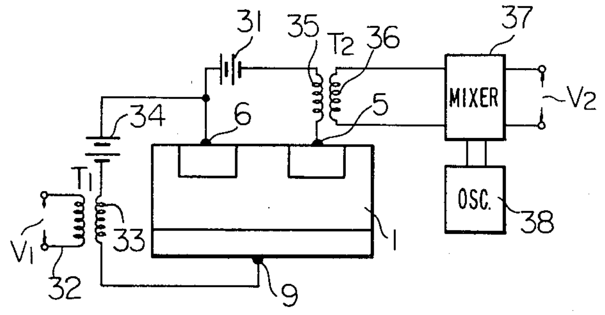
FIG. 12 shows a further embodiment adapted to be a system for frequency modulation using the oscillator of FIG. 1.

In FIG. 12 there is shown a frequency modulating system using the photosensitive solid oscillator, as a further embodiment of the system according to the present invention.

In the drawing, 1 is the solid oscillator of the kind referred to. 31 is a main direct current source giving a main voltage to the solid oscillator 1 and connected between the respective main electrodes 5 and 6 through a primary winding 35 of an output transformer $T_2$. 34 is a biasing direct current source connected between the electrode 6 and the bias electrode 9 through a secondary winding 33 of an input transformer $T_1$ and having a primary winding 32 of the input transformer $T_1$ as an input terminal. 36 is secondary winding of the output transformer $T_2$ which is used as an output terminal for a load circuit.

37 is a mixer on which a voltage whose frequency varies with an input voltage $V_1$ is impressed through the above mentioned output transformer $T_2$. 38 is a local oscillator giving a voltage of a constant oscillation frequency to the mixer 37. This local oscillator 38 produces an output voltage having a frequency of a difference between the oscillation frequency obtained from the output transformer 36 and the oscillation frequency of this local oscillator.

If the frequency of the voltage given to the mixer 37 from the local oscillator 38 is selected so as to be an oscillation frequency of an oscillation voltage at both ends of the output transformer when the input voltage $V_1$ is zero, the frequency of the output voltage $V_2$ will become zero at the time when the input voltage $V_1$ is zero and, therefore, a modulation characteristic that an oscillation frequency substantially proportional to the bias voltage will be generated is obtained.

As the frequency modulating system according to this system is formed and operated as described above, the bias voltage-frequency characteristic can be made to have a proportional relation and, further, since the oscillation frequency by the present solid oscillator is a frequency so high as to be easily radiated electromagnetically, the system can be used as it is as a carrier signal and is adapted to a wireless transmission.

Figure 13:
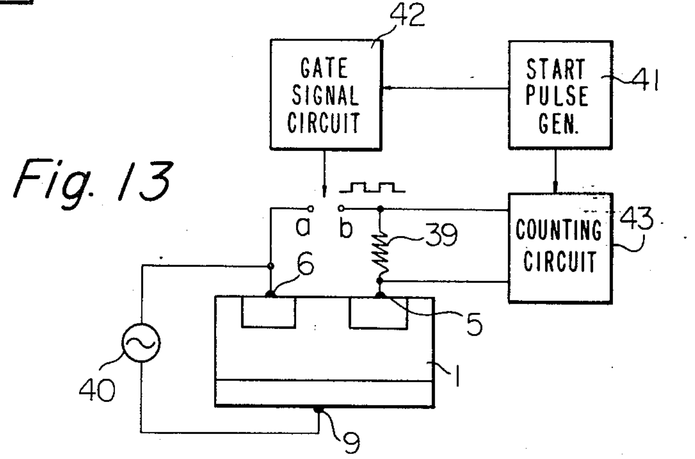
FIGS. 13 and 14 are embodiments further according to the present invention, which are analog-to-digital conversion systems.

FIG. 13 shows another embodiment of the system which is adapted to be an analogue - digital converting system using this element and the solid oscillator referred to for varying the oscillation frequency depending on variations in input voltage.

41 is a controlling circuit generating starting pulses. 42 is a gate signal circuit, which is triggered by the starting pulse of the controlling circuit 41 to generate a gate signal of a constant width as, for example, a monostable multi-vibrator. The circuit 42 is so connected that its output will be impressed on input terminals *a* and *b* of the solid oscillator 1. The terminal *a* is connected to the electrode 6 while the terminal *b* is connected to the electrode 5 through a resistor 39.

43 is a counting circuit which receives a counting input from both ends of the resistor 39.

40 is an analogue signal source inserted between the electrode 6 and the bias electrode 9.

Now, as the present system has such a gate function that, only in the case when a gate signal from the gate signal circuit 42 is impressed on the input terminals *a* and *b* upon the triggering by the controlling circuit 41 and also an analogue input is fed from the analogue input terminals ( electrodes 6 and 9), a counting input will be obtained at both ends of the resistor 39 and, as the frequency of said input obtained varies with the magnitude of the analogue input, a single solid oscillator can be used for both frequency modulating circuit and gate circuit and, therefore, an analogue - digital converter of a very simple circuit can be provided. Further, the oscillation frequency obtained from the solid oscillator is so high as to be usually about 100 KHZ and is adapted to a wire and wireless transmission. Thus there is an additional advantage that a remote indication can be simply made.

Figure 14:
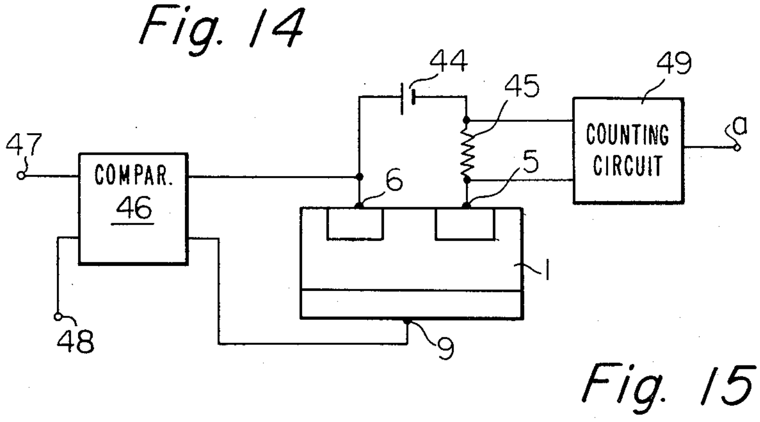

FIG. 14 shows another embodiment of the analogue-digital converting system using the solid oscillator. In the drawing, 46 is a comparator circuit whereby an analogue signal fed from an input terminal 47 and a constant saw-tooth wave signal fed as a reference voltage from an input terminal 48 are compared with each other. When the saw-tooth wave signal is larger than the analogue signal, a comparative output signal of a constant amplitude will be produced at the circuit 46. The output terminals of this comparator circuit 46 are connected between the main electrode 6 and the bias electrode 9 of the solid oscillator 1. 49 is a counting circuit for counting the number of input signals at regular intervals of time and emitting digital signals corresponding to said number, which receives a counting input from both ends of a resistor 45. This resistor 45 is an output resistor connected in series with a direct current source 44 between main electrodes 5 and 6.

Now, if an analogue signal enters such analogue digital converting system, the analogue signal will be converted with respect to the polarity and the converted signal will be applied to the comparator circuit 46. On the other hand, from the input terminal, a saw-tooth wave signal will be applied as a reference signal. Both signals will be compared in the comparator circuit 46. For the part by which the saw-tooth wave signal is larger than the converted signal, a gate signal of a constant amplitude will be issued and will be added between the electrode 6 and the bias electrode 9 of the solid oscillator 1. The solid oscillator 1 has a property that, when a constant direct current voltage is applied between the main electrodes 5 and 6 and a bias voltage of a constant amplitude is applied between the bias electrodes 9 and the electrode 6, an oscillation will be made at a constant oscillation frequency only while the bias voltage is applied, and an oscillation pulse voltage will be obtained at both ends of the output resistor 45, so that only while the gate signal enters the gate signal input terminals 6 and 9 an oscillation pulse voltage of a constant frequency will be obtained at both ends of the output resistor 45, which voltage will be applied to the counting circuit 49. The counting circuit 49 starts the operation upon receiving a starting pulse generated earlier in time than the saw-tooth signal generating phase, and stops the operation upon a stopping pulse later in the time than the signal vanishing phase, so that the circuit will count the number of the oscillation pulses applied between the phase in which the saw-tooth signal and analogue signal coincide with each other and the phase in which the saw-tooth wave signal vanishes and will generate a digital output from an output terminal *a*.

As this analogue-digital converting system is formed and operates as mentioned above, an analogue amount can be simply converted to a digital amount, the single solid oscillator can be used for both gate circuit and oscillator circuit, therefore there is an advantage that a digital amount corresponding to an analogue amount can be obtained with a very simple structure. Further, the oscillation frequency obtained from the solid oscillator is so high as to be usually about 100 KHZ, and the system is adaptable to a wireless or wire transmission and there is an additional advantage that a remote indication can be simply made.

Figure 15:
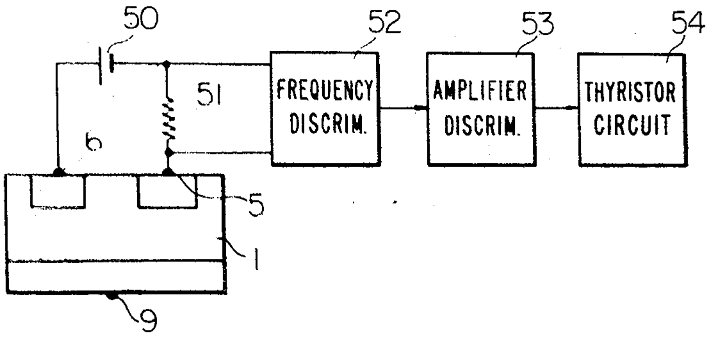
FIG. 15 is a further thyristor controlling circuitry system according to the present invention.

FIG. 15 shows a further embodiment which is adapted to a thyristor controlling circuit system using the solid oscillator. In the drawing, 52 is a frequency discriminating circuit having such characteristics that a frequency of a signal fed as an input and a reference frequency are compared with each other, the difference between them is detected, and, when the frequency of the input signal is larger than the reference frequency, a positive voltage corresponding to the difference will be obtained as an output but, when the frequency of the input signal is smaller than the reference frequency, a negative voltage corresponding to the difference will be obtained as an output. 53 is an amplitude discriminating circuit wherein an output voltage corresponding to a light from the frequency discriminating circuit 52 is superimposed on such voltage periodically varying in the voltage level as, for example, of a triangular wave or an alternating current and a proper trigger signal is generated by making this signal an input. 54 is a thyristor circuit which includes a thyristor driven by a trigger signal from the amplitude discriminating circuit 53 as, for example, a triac, silicon symmetrical switch, silicon controlled rectifying element (SCR) or the like and its load.

In such circuit system, when a light is irradiated on the solid oscillator 1, the oscillator will start to oscillate and an oscillation voltage obtained at both ends of an output resistance 51 will be given to the frequency discriminating circuit 52, in which the frequency of said oscillation voltage will be compared with the reference frequency and a direct current voltage will be generated in response to the difference. This voltage will be superimposed on the voltage of an alternating current source contained in the above mentioned amplitude discriminating circuit 53 and will be applied as a voltage elevated by a direct current voltage part to the amplitude discriminating circuit 53. When this elevated voltage becomes a voltage above the operating point of the amplitude discriminating circuit 53, a trigger voltage of a square wave will be obtained at the output terminal of the amplitude discriminating circuit 53. By this trigger voltage, the thyristor circuit 54 will be operated.

As this system operates as described above, the thyristor can be controlled in the phase in response to the magnitude of the light. Now, as the frequency of the oscillation voltage generated in the photosensitive solid oscillator is generally of a magnitude of about 100 KHZ and is in a frequency band adapted to a wireless or wire transmission, there is an advantage that this system can be easily remote-controlled by using a frequency discriminating circuit having a resonant circuit adapted to receiving signals at the input terminal.

What we claim is:

1. A control system for electric load circuit using photosensitive solid oscillator comprising the combination of a photosensitive solid oscillator comprising a semiconductive wafer, a first impurity layer formed on one surface of said wafer, second and third impurity layers formed on the other surface of the wafer as separated from each other, said first, second and third impurity layers being of reverse conducting type with respect to the wafer and containing an impurity of a higher concentration than in the wafer, ohmic electrodes provided respectively on said first, second and third impurity layers, and a source voltage applied through an impedance element between said electrodes on the second and third impurity layers in such that an avalanche between the wafer and one on the second and third impurity layers is produced so that a pulse type oscillation output will be obtained at both ends of said impedance element in such manner that the frequency of said output will vary depending on variation in light amount irradiated on the wafer or in the source voltage, and a load circuit connected to said photosensitive solid oscillator so as to operate depending on said oscillation output at the impedance element, the combination being such that said load circuit is controlled in response to the oscillation output at the both ends of the impedance element which varying depending on variations in either one of the light amount irradiated on the oscillator and the source voltage for the oscillator due to a bias signal applied between the first impurity layer and one of the second and third impurity layers of the oscillator.

2. A control system of claim 1 wherein said bias signal is provided by a series circuit of a condenser and a resistor and connected between the respective electrodes on the first impurity layer and one of the second and third impurity layers of the oscillator, and said load circuit comprises a circuit including a thyristor and a load element and connected to both ends of the resistor in said series circuit, so that the voltage at the both ends of the resistor will be applied to the gate of said thyristor.

3. A control system of claim 1 wherein said photosensitive solid oscillator is provided further with a fourth impurity layer formed on the same surface with and between the second and third impurity layers, said fourth impurity layer being of reverse conducting type with respect to the wafer and containing an impurity of a higher concentration than in the wafer, and a biasing ohmic electrode provided on said fourth impurity layer, said biasing signal source comprises a second photosensitive solid oscillator having the same structure with that as defined in claim 1, an impedance element connected between the respective electrodes on the first impurity layer and one of the second and third impurity layers of said second oscillator, and a smoothing condenser connected in paralled to said impedance element, said second oscillator being connected to the first photosensitive solid oscillator in such that the both end output voltage of the impedance element produced when a light is irradiated on the second oscillator will be applied between the both bias electrodes on the first and fourth impurity layers of the first oscillator after smoothed by the smoothing condenser, said load circuit comprises a thyristor and a load element and is connected to the first oscillator in such that the oscillation output signals obtained at both ends of the impedance between the second and third impurity layers of the first oscillator will be applied to the gate of said thyristor, so that when the light amount irradiated on the second oscillator is large the oscillation produced at output end of the first oscillator will be below a fixed value or stopped so as to cause the thyristor to be non-conducting, and when said light amount is small the said oscillation will be above said fixed value so as to cause the thyristor to be conductive and thereby the load element is actuated.

4. A control system of claim 1 wherein said bias signal source comprises a series circuit of an input signal source and a biasing direct current source, and said load circuit comprises a mixer and a local oscillator connected to said mixer so as to apply thereto its oscillation voltage, so that the both end output voltage of the impedance of the photosensitive solid oscillator will be applied to said mixer, and the oscillation voltage of said local oscillator of which frequency is selected to be the same with the oscillation frequency of the both end oscillation voltage of said impedance at the time when the signal to said input signal source is zero will be applied to the mixer, whereby a voltage of a frequency in proportional relationship to the voltage at the input signal source is obtained at output end of the mixer.

5. A control system of claim 1 wherein said voltage source comprises a square wave generating circuit, said load circuit comprises a counting circuit emitting digital signals in response to input signals, said bias signal source is an input signal source, and said square wave generating circuit and said counting circuit are controlled by a control circuit providing start and stop signals, so that, when the voltage from said square wave generating circuit and the bias signal from said input signal source are applied to the photosensitive solid oscillator, the oscillation output of a frequency which varying in response to the magnitude of the input to the input signal source will be provided to the counting circuit.

6. A control system of claim 1 wherein said bias signal source comprises a comparator circuit which generates a signal of a fixed voltage when analogue signal input and saw-tooth wave signal are applied thereto, and said load circuit comprises a counting circuit emitting digital signals responsive to input signals thereto, so that said counting circuit will be operated by an output voltage obtained at both ends of the impedance of the oscillator in response to the signals of fixed voltage from said comparator circuit.

7. A control system of claim 1 wherein said load circuit comprises a switching circuit which receives output voltage from the impedance of the oscillator through a frequency discriminator circuit and an amplitude discriminator circuit, so that said switching circuit will be operated in response to the light amount irradiated on the oscillator.

* * * * *